United States Patent
Wolter et al.

(10) Patent No.: US 7,369,288 B2
(45) Date of Patent: May 6, 2008

(54) MICROMECHANICAL OPTICAL ELEMENT HAVING A REFLECTIVE SURFACE AS WELL AS ITS USE

(75) Inventors: Alexander Wolter, Dresden (DE); Thomas Klose, Dresden (DE)

(73) Assignee: Fraunhofer-Gesellschaft zur Forderung der angewandten Forschung e.V. (DE)

( * ) Notice: Subject to any disclaimer, the term of this patent is extended or adjusted under 35 U.S.C. 154(b) by 0 days.

(21) Appl. No.: 11/486,352

(22) Filed: Jul. 13, 2006

(65) Prior Publication Data

US 2007/0017994 A1      Jan. 25, 2007

(30) Foreign Application Priority Data

Jul. 13, 2005    (DE)    ............... 10 2005 033 800

(51) Int. Cl.
  *G02B 26/08*   (2006.01)
(52) U.S. Cl. .................. 359/224; 359/221; 359/872
(58) Field of Classification Search .............. 359/224
  See application file for complete search history.

(56) References Cited

U.S. PATENT DOCUMENTS

| | | | |
|---|---|---|---|
| 5,312,513 A | | 5/1994 | Florence et al. |
| 5,917,647 A | * | 6/1999 | Yoon ..................... 359/298 |
| 6,198,180 B1 | * | 3/2001 | Garcia ..................... 310/36 |
| 6,393,913 B1 | * | 5/2002 | Dyck et al. ............. 73/504.12 |
| 6,865,313 B2 | * | 3/2005 | Mao et al. ................... 385/18 |
| 6,906,848 B2 | * | 6/2005 | Aubuchon .................. 359/291 |
| 2002/0012180 A1 | | 1/2002 | Yu et al. |
| 2002/0041455 A1 | | 4/2002 | Sawada et al. |
| 2002/0064192 A1 | * | 5/2002 | Missey et al. ................ 372/20 |
| 2003/0007262 A1 | | 1/2003 | Tsuboi et al. |
| 2005/0099665 A1 | * | 5/2005 | Lee et al. ................... 359/213 |

FOREIGN PATENT DOCUMENTS

| | | |
|---|---|---|
| DE | 43 34 267 A1 | 4/1994 |
| DE | 199 63 382 A1 | 7/2001 |
| DE | 101 41 561 A1 | 9/2002 |
| DE | 10 2004 037 833 A1 | 3/2005 |
| EP | 0 754 958 A2 | 1/1997 |
| WO | WO 01/53872 A1 | 7/2001 |

* cited by examiner

Primary Examiner—Stephone B. Allen
Assistant Examiner—Jade Callaway
(74) Attorney, Agent, or Firm—Young Basile

(57) ABSTRACT

By way of example, it would also be possible to dispense in a manner which is not illustrated with the spring elements 2, and then for the element 1 to carry out an oscillating translational deflection. Micromechanical optical elements have a reflective surface which can be deflected electrostatically or electromagnetically in a known manner and which can be used for a large number of applications. The objective is to provide an element such as this at low cost and with improved dynamic deformation behaviour. The elements with a reflective surface are in this case held by spring elements, in which case the element which can be deflected is held on mutually opposite sides by in each case at least two mutually independent spring elements.

12 Claims, 7 Drawing Sheets

Plate
Bar structure
Torsion springs

MICROMECHANICAL OPTICAL ELEMENT HAVING A REFLECTIVE SURFACE AS WELL AS ITS USE

BACKGROUND

The invention relates to micromechanical optical elements having a reflective surface, which can be deflected in a manner known per se by means of electrostatic or electromagnetic forces, such that incident electromagnetic radiation can be reflected as a function of the respective deflection of the element. The elements according to the invention can advantageously be used in deflection units for laser beams or light beams, bar-code readers, projection displays, retina scanning displays, readers for patterns and images, test equipment, laser printers or direct exposure devices.

Micromirrors such as these are in this case deflected both translationally and rotationally and are then referred to as "pumping or tilting mirrors". The deflection is in this case carried out at a very high frequency, so that corresponding accelerations occur. Since the deflected elements are normally in the form of plates with a different circumferential geometry, their moment of inertia and the limited strength and stiffness lead to dynamic deformation, which in turn leads to deformation of the reflective surface. With the conventional design of the elements to be deflected, however, even deformation in the nanometer range leads to an undesirable influence on the reflection behaviour.

This negative influence increases as the respective oscillation frequency rises. This can admittedly be counteracted by increasing the strength and stiffness of an element which can be deflected. However, increase in the mass results here, hence the need to increase at least the forces which are required for deflection.

In this case, FIG. 1 illustrates a conventional solution in which an element in the form of a plate is held by two torsion springs arranged mutually opposite, and the element can be pivoted backwards and forwards about the rotation axis on which the torsion springs are arranged. The lower illustration shows, schematically, the dynamic deformation of the element at a point at which the pivoting movement is reversed. The reflective surface is in this case partially convex and concave, so that incident light is reflected differently, depending on the deformation.

However, the dynamic deformation can be reduced only slightly as well by a solution as shown in FIG. 2. This corresponds essentially to the scanner mirrors described in US 2005/0045727 A1. In this case a torsion bar spring is intended to be attached to the mirror at a plurality of points, in which case a solution as shown in FIG. 2 with only two attachment points is used for this specific situation. In addition, however, further spring elements are intended to be formed on the torsion bar along its longitudinal axis, and are intended to be arranged there. This involves a considerable amount of manufacturing effort, since these spring elements must be designed to be very small. It is thus likewise impossible to specifically compensate for forces and torques which have locally different effects because of the moment of inertia, in particular the restoring forces and torques which are initiated by the torsion spring.

SUMMARY

The object of the invention is thus to provide a micromechanical optical element which can be produced at low cost and achieves a better dynamic deformation behaviour.

According to the invention, this object is achieved by an optical element which has a reflective surface, which can be deflected by means of electrostatic or electromagnetic forces and is held by means of spring elements. Advantageous uses include deflection elements for laser beams or light beams, in bar-code readers, in projection displays, retina scanning displays, readers for patterns and images, in test equipment, in laser printers or direct exposure devices. Refinements and development of the invention such as these can be achieved by other features.

In the invention, the element which can be deflected in an oscillating manner, which is achieved by means of electrostatic or electromagnetic forces in a manner known per se, is held on mutually opposite sides by in each case at least two mutually independent spring elements. The deflection may be carried out translationally, but preferably rotationally within a predeterminable pivoting angle range. In the last-mentioned case, this may be done electrostatically by means of a comb drive which is known per se.

In this case, at least one of these spring elements should act at least two points which are arranged at a distance from one another. However, this may also be the case for all spring elements.

However, in one embodiment, in each case one spring element may also act on an axis which may then be the rotation axis, and at least two further spring elements may act on the element which can be deflected, at least two points which are arranged at a distance from one another.

It may also be advantageous for the points of action of spring elements to be arranged at equal distances and/or symmetrically.

However, the points of action can also be arranged distributed over the entire external circumference, so that spring elements are also arranged in the end-face area of the element which can be deflected, this being where the maximum pivoting can occur. For example, in addition to increased restoring force, it is thus possible for the torques to contribute to better planarity or flatness of the reflective surface of the element which can be deflected.

However, spring elements can also act on stiffening elements which are formed on the rear face of the elements which can be deflected, so that the respective advantageous effects can be used in combination.

The spring element choice is not restricted to torsion springs and, very particularly, not to torsion bar springs. Pure bending springs and torsion bending springs may also be used on their own or in combination.

Taking account of the respective lever ratios, that is to say the respective distances between the points of action of spring elements on the element which can be deflected, the individual spring elements may also have different, appropriately matched, spring constants.

However, in one alternative, all of the points of action may also be arranged such that no point of action of a spring element is arranged on the rotation axis.

The local distribution which can be achieved according to the invention of the forces and torques which the spring elements cause to act on the element which can be deflected allow the overall torque and the dynamic deformation to be considerably reduced, in particular in conjunction with the matching of the spring constants or spring stiffnesses of the spring elements which are used.

In addition, it has been found that, in the case of an element according to the invention, spring elements which are connected on the rotation axis make only a minor contribution to the overall restoring torque. It is thus also possible to dispense with an embodiment such as this, and points of action of spring elements should then be chosen at shorter distances from the rotation axis.

The invention will be explained in more detail in the following text by way of example.

DETAILED DESCRIPTION

Figure 1:
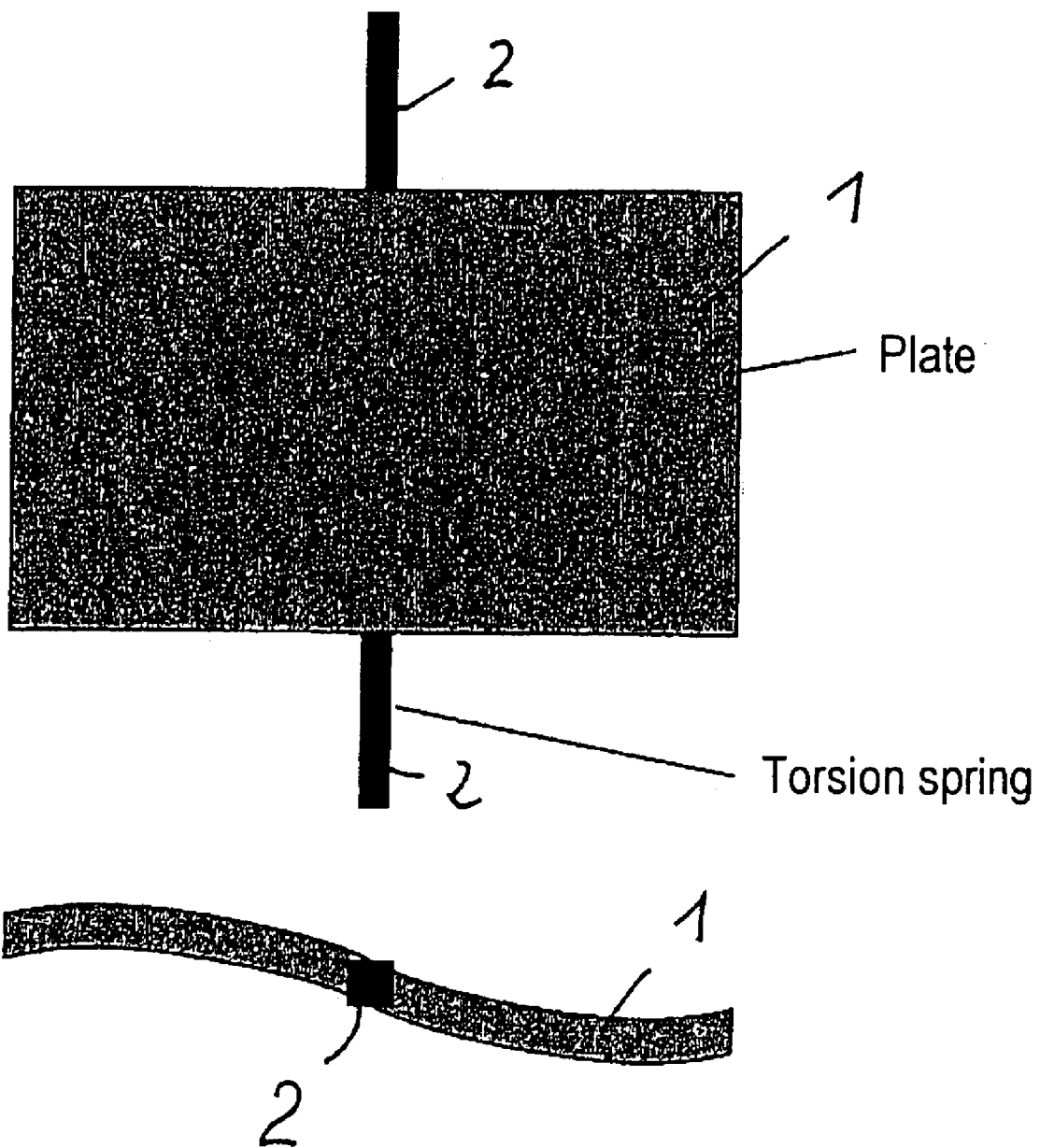
FIG. 1 shows one example according to the prior art, illustrated schematically.
Figure 2:
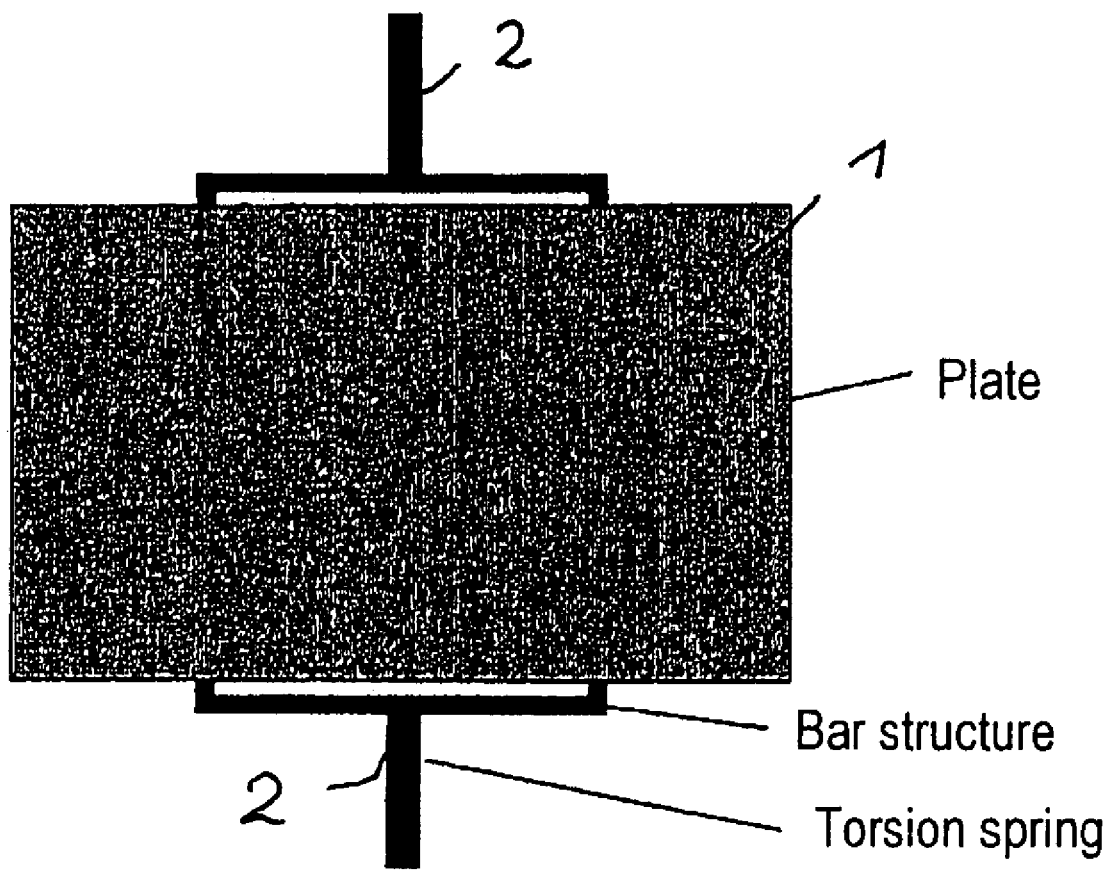
FIG. 2 shows a further example according to the prior art.
Figure 2:
Figure 3:
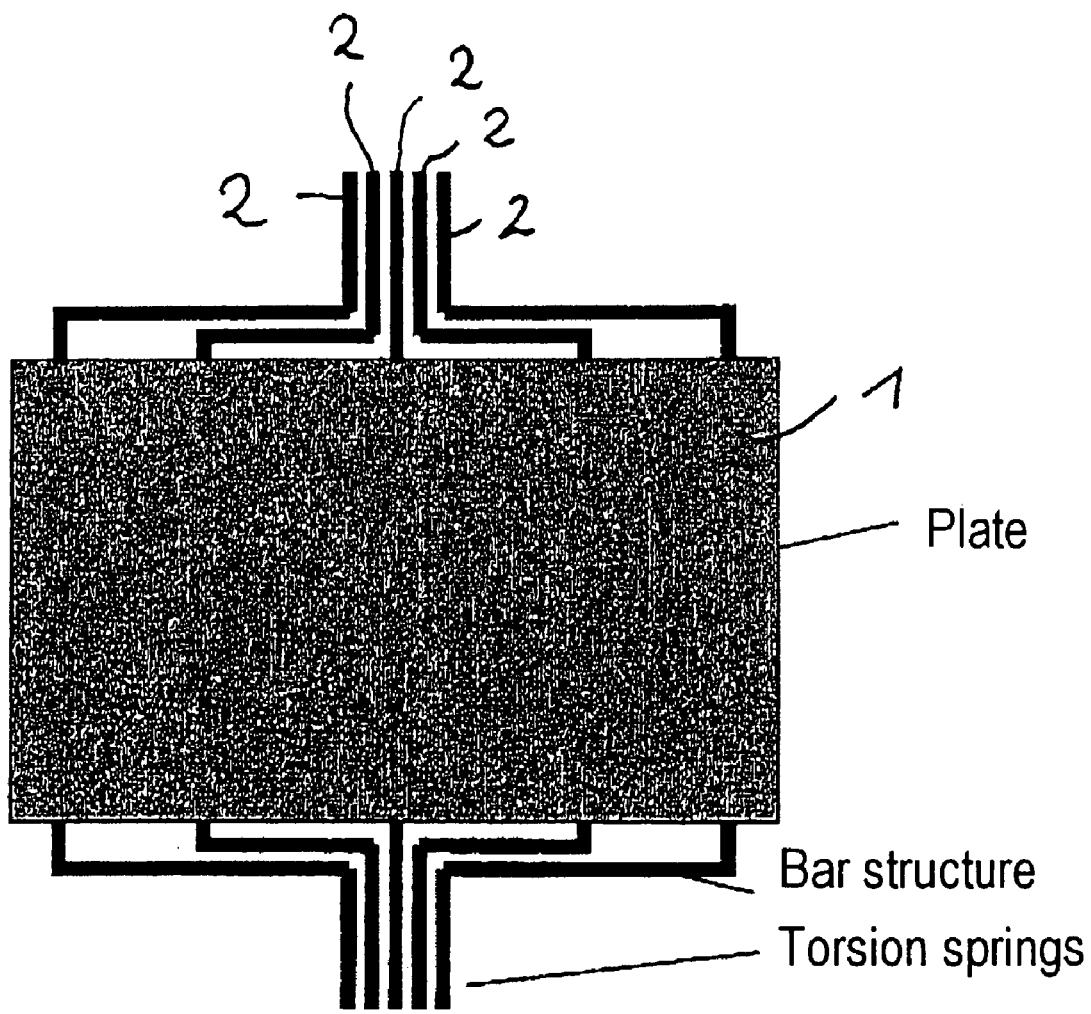
FIG. 3 shows a schematic illustration of one example of the invention.
Figure 3:
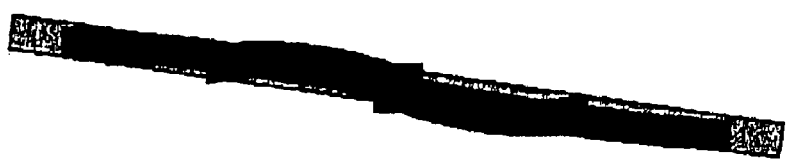

In the examples according to the prior art shown in FIGS. 1 and 2, in the same way as the example according to the invention which is shown in FIG. 3, the lower illustration shows the respective dynamic deformation of an element 1 which can be deflected by pivoting.

In the case of the example according to the invention shown in FIG. 3, five spring elements 2 are in each case provided on the two mutually opposite sides of an element 1 which can be deflected, in this case with a rectangular shape. A spring element 2 arranged centrally is arranged on the axis of rotation, about which the element 1 can be pivoted backwards and forwards within a predeterminable angle range. This is in the form of a pure torsion spring and in each case acts on the element 1 at only one point.

Each of the other four spring elements 2 then always acts on the element 1 at in each case two points at appropriate distances and with appropriate lever arms, while maintaining symmetrical relationships with respect to the axis of rotation.

The lower illustration shows the reduced dynamic deformation.

Figure 4:
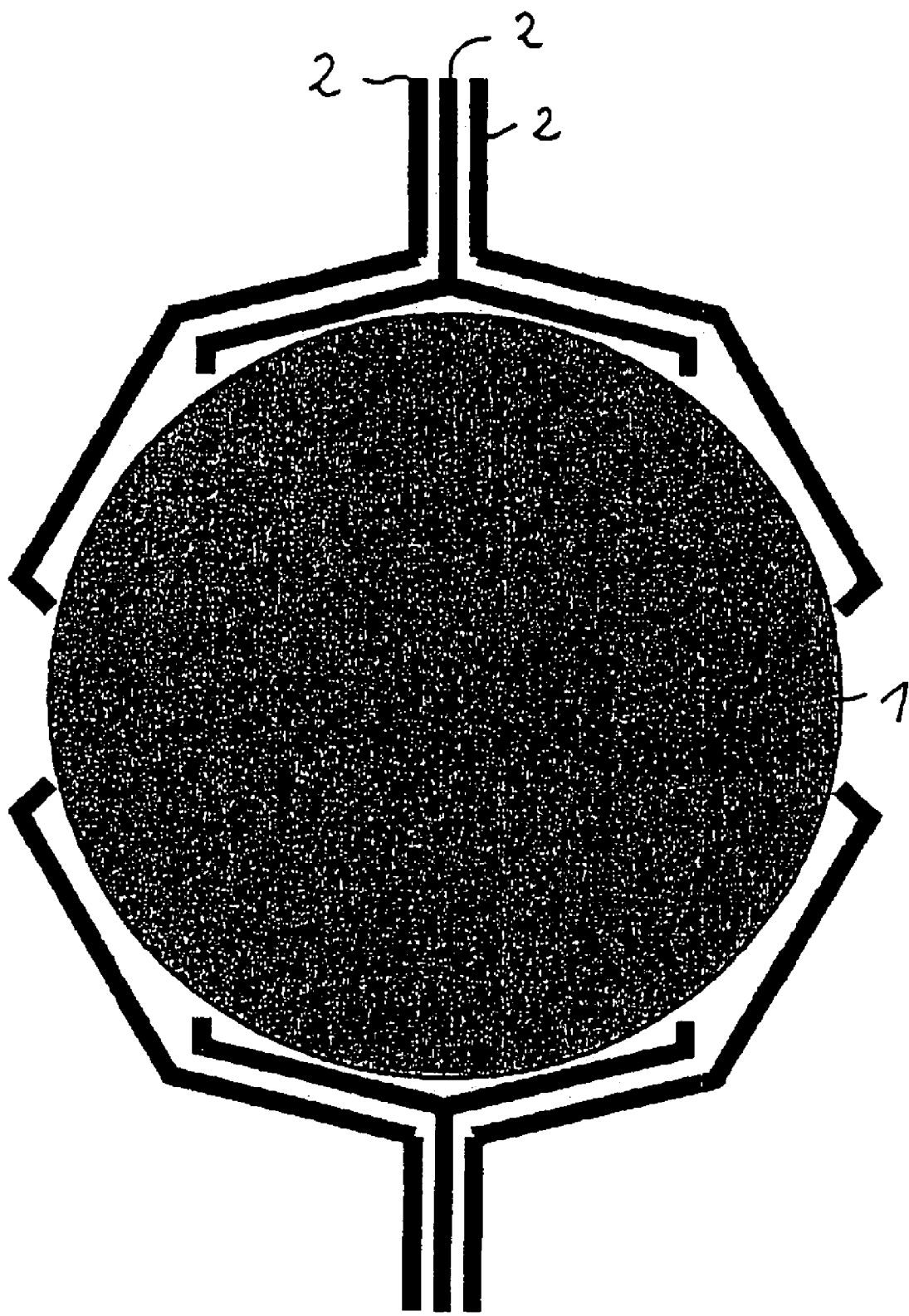
FIG. 4 shows a schematic illustration of a further example.

In the example shown in FIG. 4, three spring elements 2 are in each case arranged on the two opposite sides of an element 1 which can be deflected. In this case, that spring element 2 which is arranged on the inside has two points of action, and the two outer ones each have one point of action on the element 1 which can be deflected, in which case none of the points of action is arranged on the axis of rotation, but at a distance from it. The points of action of the outer spring elements 2 are each arranged at equal distances from the axis of rotation.

Figure 5:
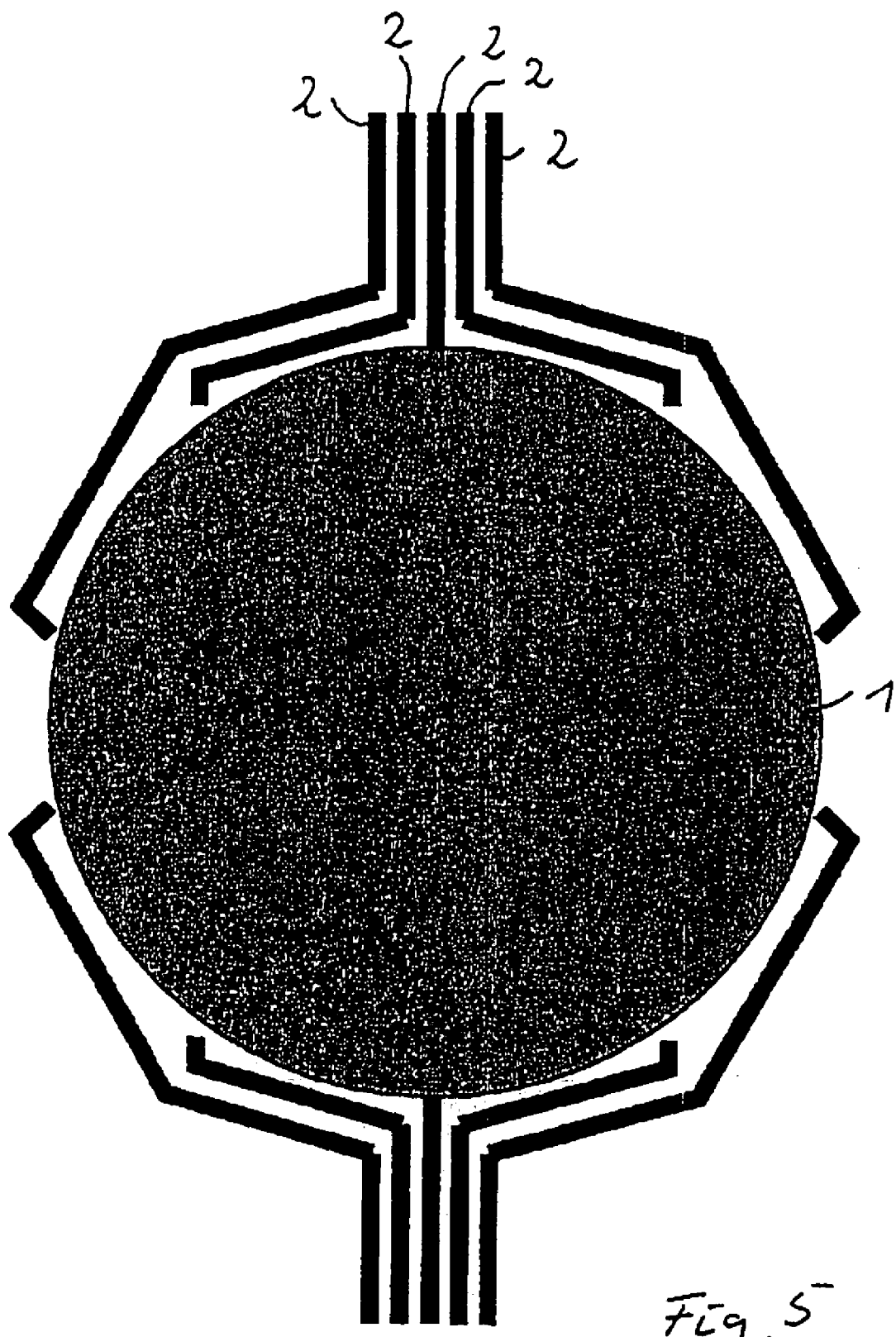
FIG. 5 shows a further example according to the invention, illustrated schematically.

In the example shown in FIG. 5, five spring elements 2 are in each case arranged on the two sides of an element 1 which can deflected. The spring element 2 which is arranged centrally between the other spring elements 2 on the axis of rotation and has a single point of action is only a simple torsion spring.

Each of the four other spring elements 2 once again each act on the element 2 at only one point, with corresponding distances analogously to the statements which have been made with respect to the example shown in FIG. 4.

Figure 6:
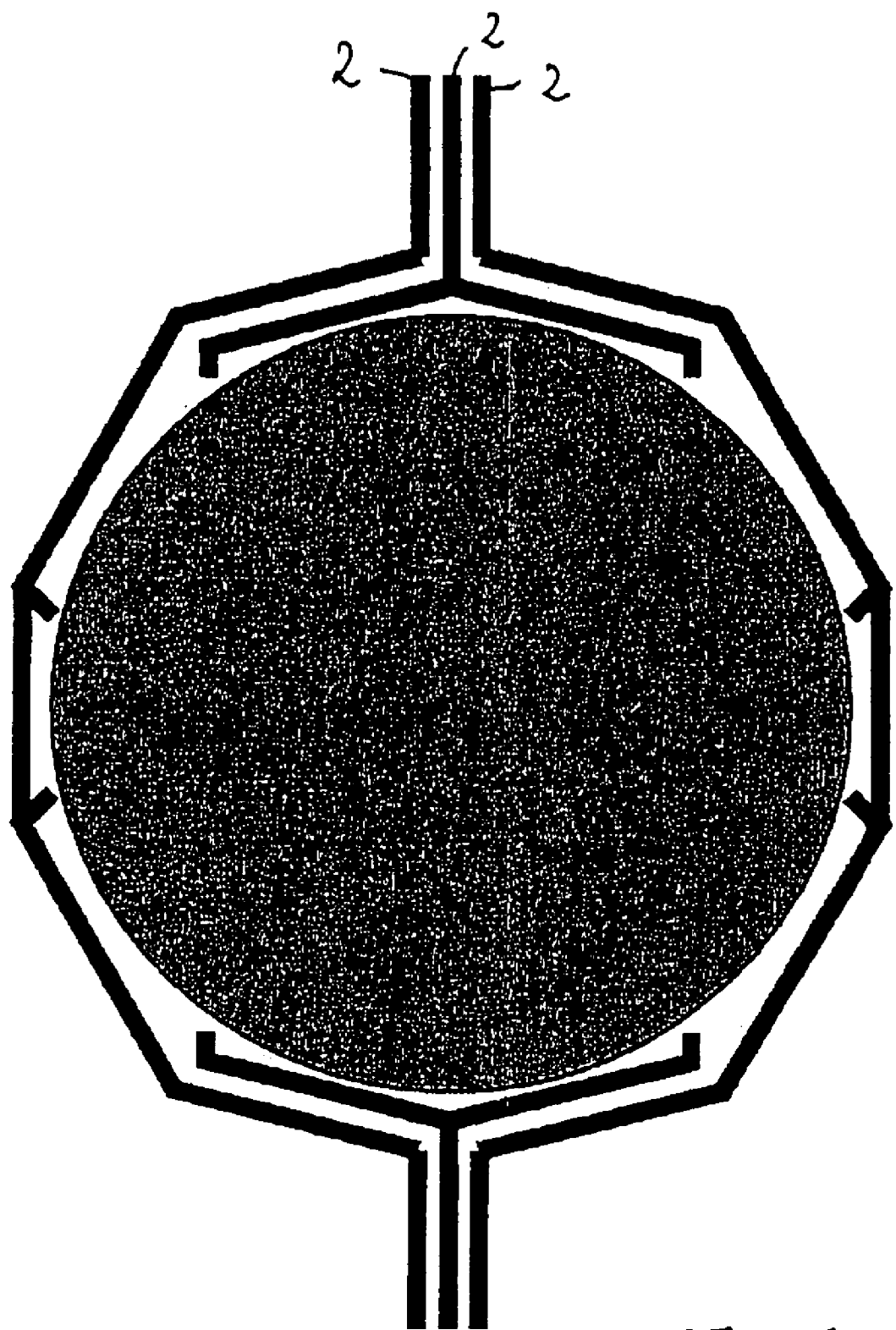
FIG. 6 shows a schematic illustration of a further example according to the invention.

In the example shown in FIG. 6, a central spring element 2 is once again provided, is aligned on the axis of rotation and in each case acts on the element 1 at two points which are arranged at a distance from it.

The two further spring elements 2 effectively form a semicircle, and/or opposite spring elements 2 are connected to one another and clasp the outer edge of the element which can be deflected. In this case, two points of action are in each case provided on the element 1 and are arranged symmetrically with respect to the axis which is aligned orthogonally with respect to the axis of rotation. However, it would also be possible to arrange only one point of action on this axis, in a manner which is not illustrated.

Figure 7:
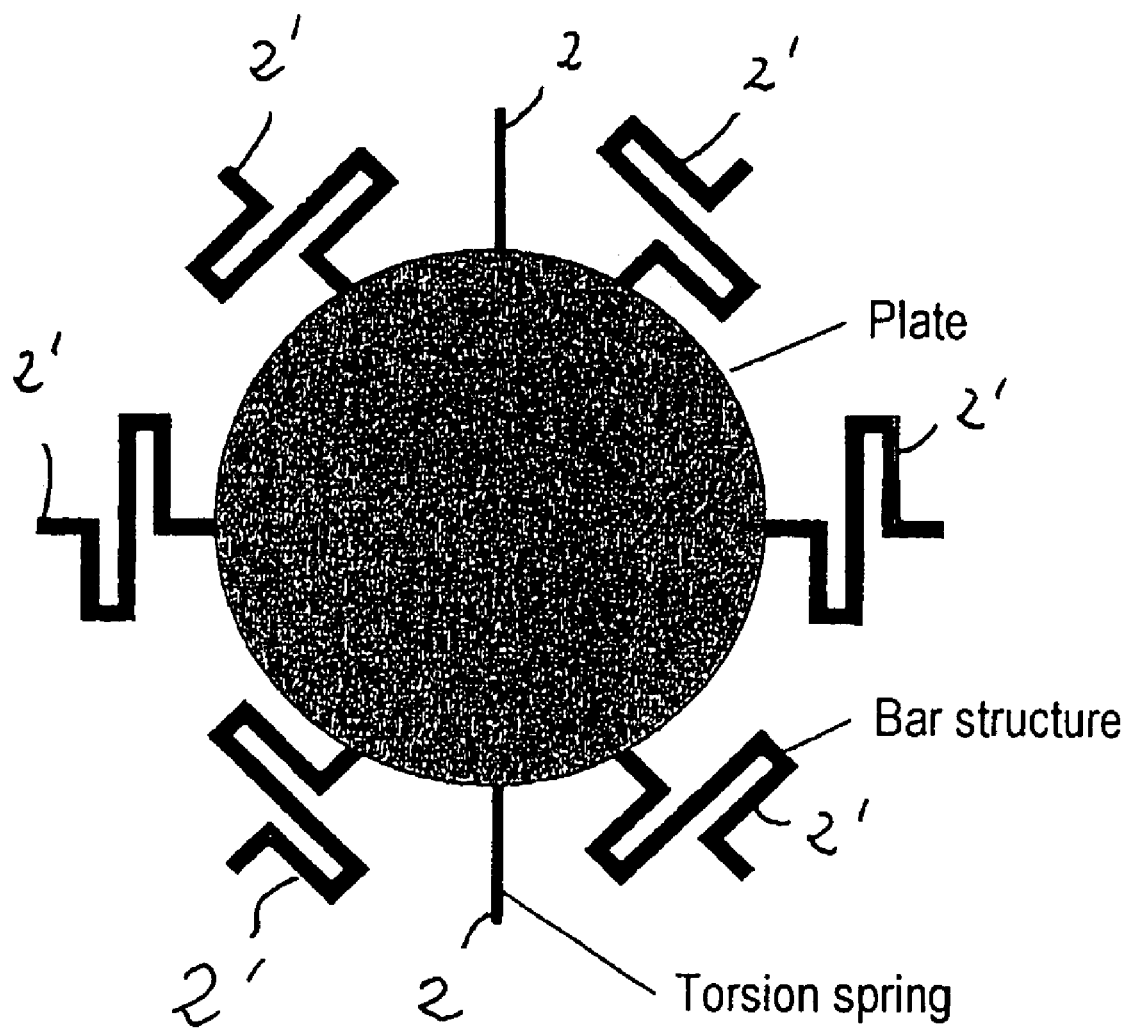
FIG. 7 shows one example of an element according to the invention.

The example shown in FIG. 7 undoubtedly relates to claim 3. In this case, one spring element 2 is arranged as a torsion spring on the axis of rotation. In addition, in this example, six spring elements 2' are provided as bending springs, whose points of action on the element 1 which can be deflected are in each case arranged at equal angular intervals from one another and in each case symmetrically with respect to the axis of rotation or the centre axis (which is arranged orthogonally with respect to this) of the element 1.

FIG. 7 also shows one possible embodiment for spring elements 2' such as this, but in which case, however, other geometries are also possible.

By way of example, in this example of the invention, it would also be possible to dispense in a manner which is not illustrated with the spring elements 2, and then for the element 1 to carry out an oscillating translational deflection.

What is claimed is:

1. Micromechanical optical element having a reflective surface, which can be deflected by means of electrostatic or electromagnetic forces and is held by means of spring elements,
   characterized in that the element which can be deflected is held on mutually opposite sides by in each case at least two mutually independent spring elements; and
   that the spring elements have different spring constants taking into account the distance between their respective points of action and the rotation axis of the element which is deflectable.

2. Element according to claim 1, characterized in that at least one of the spring elements acts on the element which is deflectable, at least two points at a distance from one another.

3. Element according to claim 1, characterized in that one spring element in each case acts on the element which is deflectable on one axis, and at least two further spring elements act on the element which can be deflected, at constant distances from this.

4. Element according to claim 1, characterized in that the element is pivotable about one axis.

5. Element according to claim 1, characterized in that an electrostatic comb drive is provided for deflection.

6. Element according to claim 1, characterized in that the points of action of spring elements are arranged at equal distances from one another.

7. Element according to claim 1, characterized in that the points of action of spring elements are arranged symmetrically.

8. Element according to claim 1, characterized in that points of action of spring elements are arranged distributed over the entire circumference of the element which can be deflected.

9. Element according to claim 1, characterized in that points of action of spring elements act on rear-face stiffening elements of the element which is deflectable.

10. Element according to claim 1, characterized in that the spring elements are in the form of at least one of bending springs and bending torsion springs.

11. Element according to claim 1, characterized in that no point of action of any of the spring elements is arranged on the rotation axis of the element which is deflectable.

12. Element according to claim 1, characterized in that two of the spring elements which are arranged mutually opposite are connected to one another.

* * * * *